(12) United States Patent
Yan

(10) Patent No.: US 7,691,156 B2
(45) Date of Patent: Apr. 6, 2010

(54) DEVICE FOR REPAIRING CONDUCTING LINE AND REPAIRING METHOD USING SAME

(75) Inventor: Shuo-Ting Yan, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 116 days.

(21) Appl. No.: 12/009,013

(22) Filed: Jan. 15, 2008

(65) Prior Publication Data
US 2008/0171401 A1 Jul. 17, 2008

(30) Foreign Application Priority Data
Jan. 15, 2007 (TW) .............................. 96101399 A

(51) Int. Cl.
*H01L 21/00* (2006.01)
(52) U.S. Cl. ...................... 29/25.01; 118/669; 118/670
(58) Field of Classification Search ................ 29/25.01; 118/669, 670
See application file for complete search history.

(56) References Cited

U.S. PATENT DOCUMENTS

| 5,446,961 A | 9/1995 | Levite et al. |
| 5,741,557 A * | 4/1998 | Corbin et al. ............... 427/469 |
| 5,973,295 A * | 10/1999 | Corbin et al. ............... 219/229 |
| 2004/0248329 A1* | 12/2004 | Satake et al. .................. 438/16 |
| 2009/0130782 A1* | 5/2009 | Itahashi et al. ................. 438/6 |

* cited by examiner

*Primary Examiner*—George Fourson
(74) *Attorney, Agent, or Firm*—Wei Te Chung

(57) ABSTRACT

An exemplary repairing method includes providing a substrate having a plurality of conducting lines; detecting a broken position of one of the conducting lines; switching on a nozzle; and forming a copper layer at the broken position on the substrate. The repairing method of the present invention employing a repairing device for performing a chemical vapor deposition (CVD) method to forming the copper layer at a position of the broken defect of one of the conducting lines.

13 Claims, 3 Drawing Sheets

DEVICE FOR REPAIRING CONDUCTING LINE AND REPAIRING METHOD USING SAME

FIELD OF THE INVENTION

This invention relates to a device for repairing conducting lines of semiconductor integrated circuit (IC) chips and a repairing method employing the device.

GENERAL BACKGROUND

With the advent of modern day electronics, circuits on a printed circuit board (PCB) or ceramic modules or semiconductor IC chips have become more and more dense. As a result, electrical lines or conducting lines are thinner and narrower so that more of them can be placed in a given area.

In a typical process for manufacturing ceramic modules or chips, conducting materials such as aluminum or aluminum alloy are widely used to make conducting lines or repair semiconductor IC chips. In order to get thinner and narrower conducting lines without increasing the inner resistance, copper replaces aluminum or aluminum alloy because copper has a low resistivity, a high melting point, a high thermal conductivity, and can be deposited by processes such as a chemical vapor deposition (CVD) method.

Normally, in a typical method for repairing conducting lines of a PCB, an operator can observe and find a broken point of a conducting line, and then repair the broken conducting line with solder by a hot press method.

Because the conducting lines of the PCB become thinner and narrower, the operator has more difficulties in finding the broken point of a conducting line by his or her eyes, thus the operation of the operator for soldering the broken line is hard to be performed.

It is desired to provide a device which can overcome the above-described deficiency.

SUMMARY

In one preferred embodiment, a repairing method includes providing a substrate having a plurality of conducting lines; detecting a broken position of one of the conducting lines; switching on a nozzle; and forming a copper layer at the broken position on the substrate.

Other novel features and advantages will become more apparent from the following detailed description when taken in conjunction with the accompanying drawings.

DETAILED DESCRIPTION OF PREFERRED EMBODIMENTS

Figure 1:
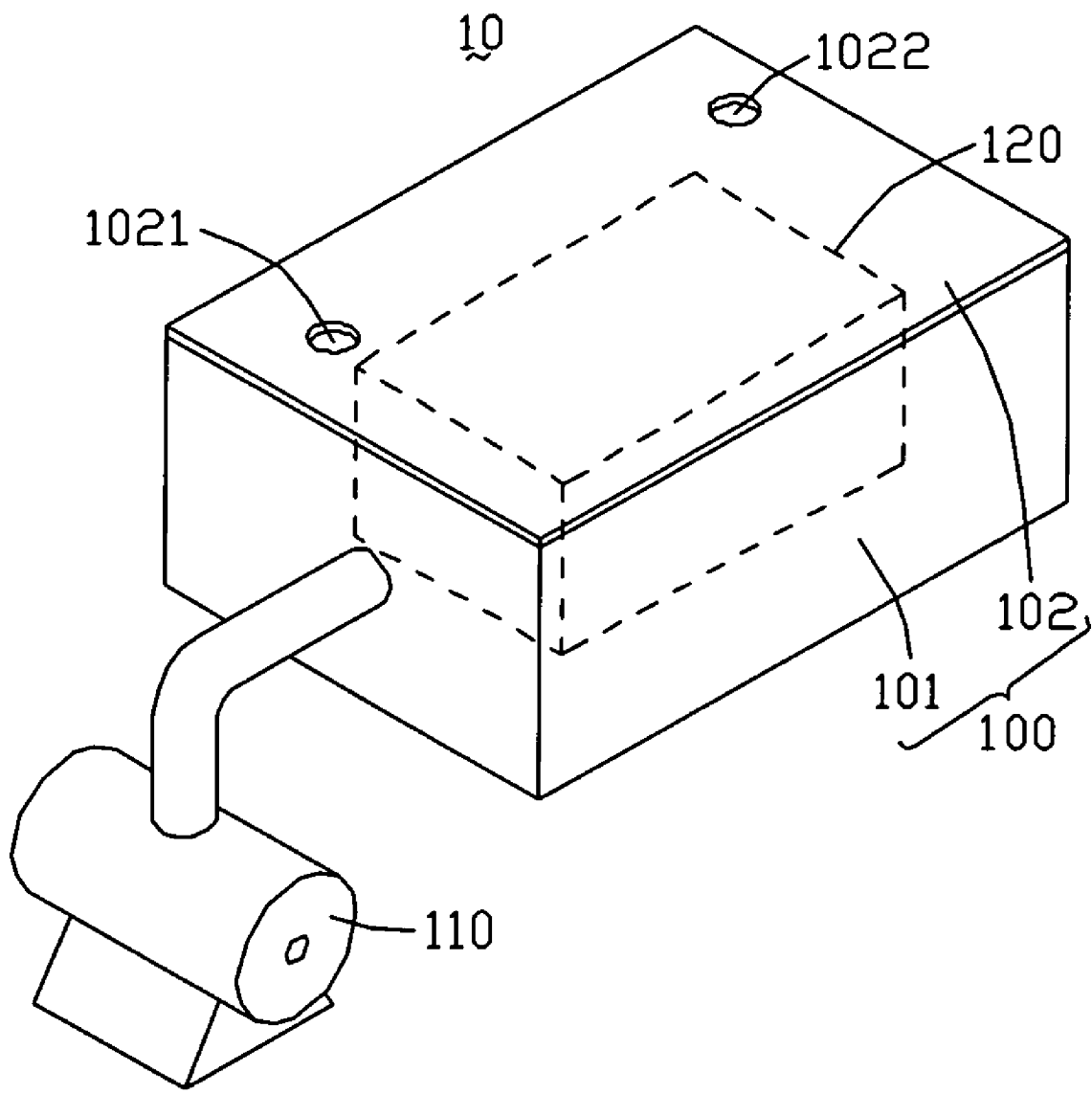
FIG. 1 is an isometric view of a repairing device according to an exemplary embodiment of the present invention, the repairing device including a box and a main body.

Referring to FIG. 1, a repairing device 10 according to an exemplary embodiment of the present invention is shown. The repairing device 10 includes a shell 100, a vacuum pump 110, and a main body 120 located in the shell 100. The vacuum pump 110 is connected to a first space defined between the shell 100 and the main body 120.

The shell 100 has the shape of a cuboid, and includes a hollow box 101 having an opening and a cover 102 covering the opening of the box 101. The box 101 and a cover 102 form a space for accommodating the main body 120.

Figure 2:
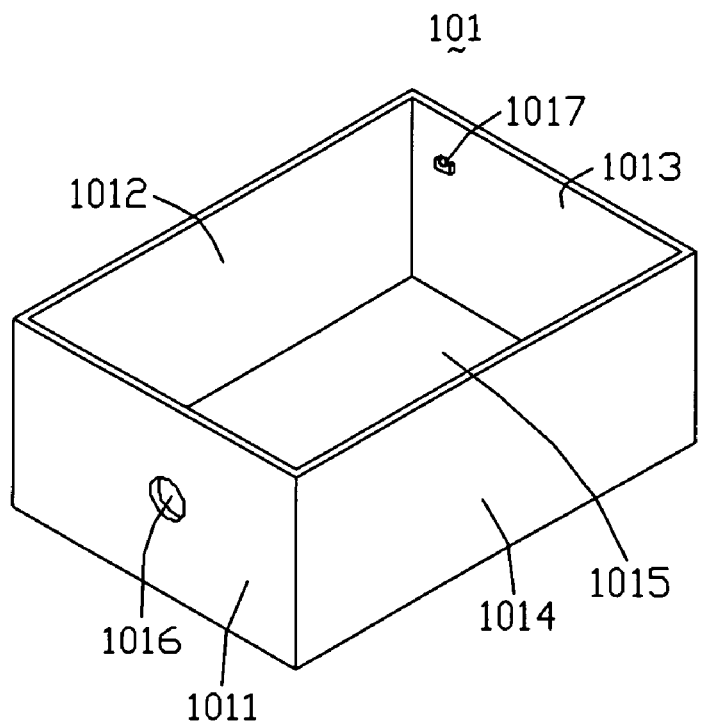
FIG. 2 is a reversed, isometric view of the box of the repairing device of FIG. 1.

Referring also to FIG. 2, the box 101 includes a first side wall 1011, a second side wall 1012, a third side wall 1013, a fourth side wall 1014, and bottom plate 1015. The four side walls 1011, 1012, 1013, 1014 are connected end to end. The bottom plate 1015 is connected with the four side walls 1011, 1012, 1013, 1014. The box 101 further includes a first through hole 1016 defined in the first side wall 1011, two first supporting arms (not shown) disposed at an inner surface of the first side wall 1011, two second supporting arms 1017 disposed at an inner surface of the third side wall 1013 corresponding to the two first supporting arms 1017. Heights of the supporting arms are equal to each other. A distance between the two first supporting arms is approximately equal to a distance between the second supporting arms 1017. The vacuum pump 110 are connected with the shell 100 through the first through hole 1016.

A second through hole 1021 and a third through hole 1022 are defined in the cover 102.

Figure 3:
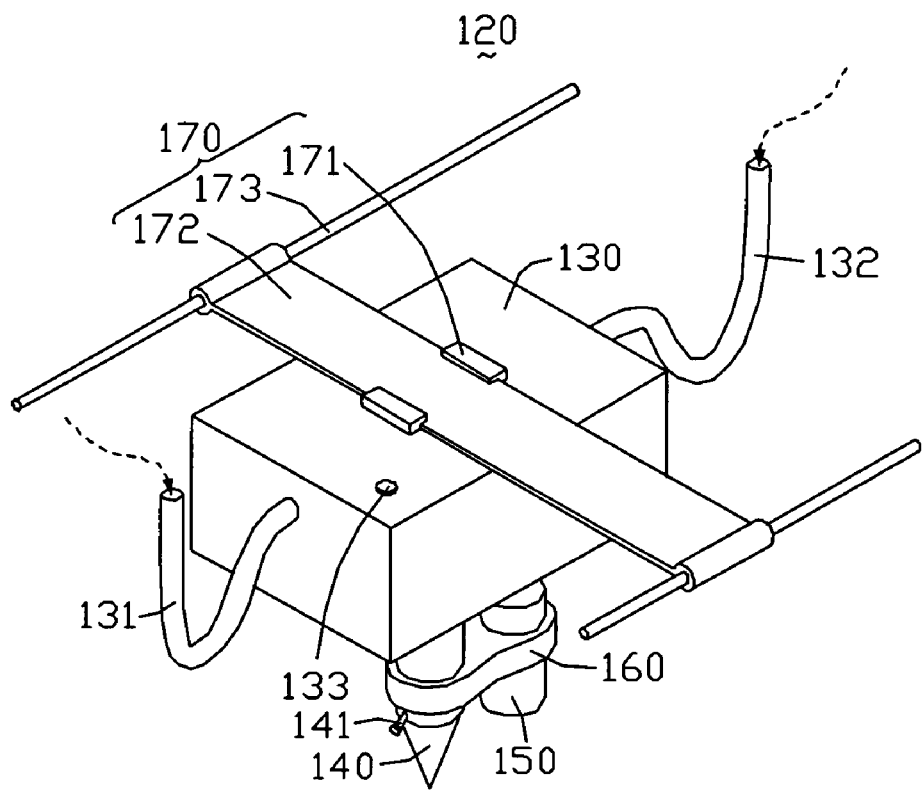
FIG. 3 is a reversed, isometric view of the main body of the repairing device of FIG. 1.

Referring also to FIG. 3, the main body 120 includes a chamber 130, a first air pipe 131, a second air pipe 132, a nozzle 140, a microscope 150, a connector 160, and a localizer 170.

The localizer 170 is positioned at the top of the main body 120, and includes two parallel glide paths 173, a shift bar 172, and a pair of shift lumps 171. The two parallel glide paths 173 are arranged parallel to the bottom plate 1015, and are supported by the supporting arms 1017, 1018 respectively. The shift bar 172 is arranged perpendicular to the glide paths 173, and is engaged with the glide paths 173 at two ends such that the shift bar 172 can move along the glide paths 173 in a first direction. The shift lumps 171 include two slide arms (not labeled), respectively, which extend at two opposite sides of the shift bar 172 for holding the shift bar 172. A base surface of each shift lump 171 is fixed with a top surface of the chamber 130 such that the chamber 130 and the shift lumps 171 can move along the shift bar 172 in a second direction perpendicular to the direction. An operation of the localizer 170 can be controlled by a stepper motor (not shown).

The chamber 130 includes an air pressure regulating hole 133, a fourth through hole (not shown) in a first side of the chamber 130, and a fifth through hole (not shown) in a second side of the chamber 130. An end of the first air pipe 131 is received in the second through hole 1021 of the cover 120 and the other end of the first air pipe 131 is connected to the fourth through hole of the chamber 130. An end of the second air pipe 132 is received in the third through hole 1022, and the other end of the second air pipe 132 is connected to the fifth through hole of the chamber 130. The first and second air pipes 131, 132 are used to input two different kinds of gases into the chamber 130. The air pressure regulating hole 133 is used to regulate an air pressure in the chamber 130.

The nozzle 140 is fixed at a base surface of the chamber 130, and includes an inner channel connected to an inner space of the chamber 130. A button for switching on or switching off the nozzle 140 is arranged at a middle part of the nozzle 140.

The microscope 150 is fixed with the nozzle 140 by the connector 160 such that the microscope 150 can move around the nozzle 140. A diameter of a tip of the nozzle 140 is approximately equal to $1.0 \times 10^{-6}$ m~$10.0 \times 10^{-6}$ m.

Figure 4:
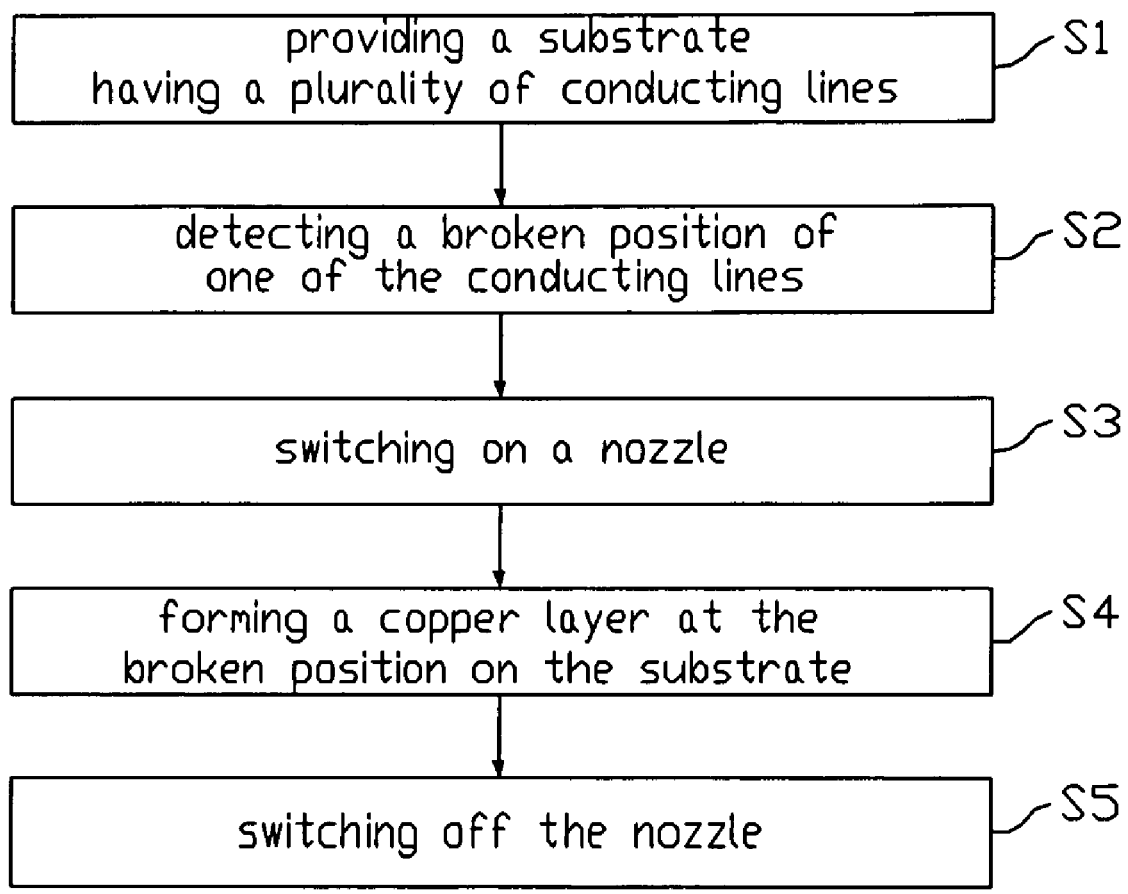
FIG. 4 is a flowchart summarizing an exemplary method for repairing a conducting line according to an exemplary embodiment of the present invention.

Referring to FIG. 4, this is a flowchart summarizing an exemplary conducting line repairing method employing the repairing device 10. The repairing method includes: step S1, providing a substrate having a plurality of conducting lines; step S2, detecting a broken position of one of the conducting lines; step S3, switching on the nozzle 140; step S4, forming a copper layer at the broken position on the substrate; and step S5, switching off the nozzle 140.

In step S1, the substrate can be a printed circuit board (PCB) or a substrate of a liquid crystal display (LCD). The provided substrate is placed on the bottom plate 101 of the box 101 after the cover 102 is opened.

In step S2, the microscope 150 is used to detect the broken position of the conducting line on the substrate. The localizer 170 moves the nozzle 140 to the broken position.

In step S3, the button 141 is pressed in order to switch on the nozzle 140 when the tip of the nozzle 140 is aligned with the broken position. At the same time, the inner channel of the nozzle 140 is communicated with the inner space of the chamber 130.

In step S4, a chemical vapor deposition (CVD) method is performed to form a copper layer at the broken position. In this process, a first reaction gas is a precursor Cu(β-diketonate)$_2$ of cupric compound Cu$^{II}$ such as Cu(hfac)$_2$, and a second reaction gas is a reducing gas such as H$_2$. The first and second reaction gases react as the following formula (1):

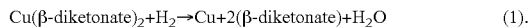

$$\text{Cu}(\beta\text{-diketonate})_2 + \text{H}_2 \rightarrow \text{Cu} + 2(\beta\text{-diketonate}) + \text{H}_2\text{O} \quad (1).$$

The first reaction gases Cu(β-diketonate)$_2$ can be obtained by dissolving Cu(β-diketonate)$_2$ into isopropyl alcohol to generate vapor of the Cu(β-diketonate)$_2$. The first reaction gas is provided into the chamber 130 via the first air pipe 131. The second reaction gas is provided into the chamber 130 via the second air pipe 132. In the chamber 130, when the temperature is in the range from 250° C.-350° C., the chemical reaction as formula (1) taken place to form a plurality of copper atoms. The copper atoms are deposited at the broken position by the nozzle 140 to form the copper layer covering the broken defect. Thus the conducting line having the broken defect is repaired by the copper layer. The air pressure regulating hole 133 of the chamber 130 and the vacuum pump 110 are used to adjust an air pressure of the first space higher than that of a second space defined in the chamber 130.

In step S5, the button 141 is released for switching off the nozzle 140 after the broken defect is repaired. Thus the inner channel of the nozzle 140 is disconnected with the inner space of the chamber 130. Once another broken defect needs to be repaired, the above steps S3-S5 are repeated.

In an alternative embodiment, aluminum (Al) can be used in the repairing method to form a aluminum layer at a position of the broken defect of one of the conducting line for repairing the conducting line. The aluminum layer can also be formed by performing a CVD method.

It is to be understood, however, that even though numerous characteristics and advantages of the present embodiments have been set out at the foregoing description, together with details of structures and functions relating to the embodiments, the disclosure is illustrative only, and changes may be made in detail, especially in matters of shape, size, and arrangement of parts and processes within the principles of the invention to the full extent indicated by the broad general meaning of the terms in which the appended claims are expressed.

What is claimed is:

1. A repairing device comprising:
   a shell comprising a space for accommodating a substrate formed with a plurality of conducting lines thereon; and
   a main body arranged in the shell and comprising a microscope for detecting a break defect of one of the conducting lines;
   wherein the main body is configured for performing a chemical vapor deposition (CVD) method to form a copper layer at a position of the break defect of one of the conducting lines.

2. The repairing device as claimed in claim 1, further comprising a vacuum pump, the main body further comprising a chamber, a first air pipe, a second air pipe, a nozzle, a connector, and a localizer, wherein the chamber is connected to the space of the shell, the microscope is fixed with the nozzle by the connector such that the microscope can move around the nozzle, and the localizer is configured to move a tip of the nozzle to align the tip with a position of the break defect of one of the conducting lines.

3. The repairing device as claimed in claim 2, wherein the shell comprises a box and a cover covering an opening of the box, the shell having a shape of a cuboid.

4. The repairing device as claimed in claim 3, wherein the cover comprises a first through hole and a second through hole defined therein, the chamber comprising a third through hole at a first side of the chamber, and a fourth through hole at a second side of the chamber, an end of the first air pipe being received in the first through hole of the cover and the other end of the first air pipe being connected to the third through hole of the chamber, an end of the second air pipe being received in the second through hole and the other end of the second air pipe being connected to the fourth through hole of the chamber 5. The repairing device as claimed in claim 4, wherein the box comprises a first side wall, a second side wall, a third side wall, a fourth side wall and a bottom plate, the four side walls being connected end to end, the bottom plate being connected with the four side walls.

6. The repairing device as claimed in claim 5, wherein the box further comprises a fifth through hole defined in the first side wall, the vacuum pump being connected with the shell through the first through hole, the chamber comprising an air pressure regulating hole, the air pressure regulating hole and the vacuum pump being configured for adjusting an air pressure of the space to be higher than an air pressure in the chamber.

7. The repairing device as claimed in claim 6, wherein the box further comprises two first supporting arms disposed at an inner surface of the first side wall, and two second supporting aims disposed at an inner surface of the third side wall corresponding to the first supporting arms, the elevation of each of the four supporting arms above the bottom plate being the same as the elevation of each of the other three supporting arms above the bottom plate.

8. The repairing device as claimed in claim 7, wherein the localizer is arranged at the top of the main body and comprises two parallel glide paths, a shift bar, and at least one shift lump, the two parallel glide paths being arranged parallel to the bottom plate and disposed on the four supporting arms, the shift bar being arranged perpendicular to the glide paths and engaged with the glide paths at two ends such that the shift bar can move along the glide paths in a first direction, the at least one shift lump holding the shift bar, a base surface of the at least one shift lump being fixed with a top surface of the chamber such that the chamber and the at least one shift lump can move along the shift bar in a second direction perpendicular to the first direction.

9. The repairing device as claimed in claim 8, wherein the at least one shift lump comprises two shift lumps, the two shift lumps comprising two slide arms, respectively, the two slide arms extending at two opposite sides of the shift bar for holding the shift bar.

10. The repairing device as claimed in claim 9, wherein operation of the localizer can be controlled by a stepper motor.

11. The repairing device as claimed in claim 2, wherein the nozzle is fixed with a base surface of the chamber, the nozzle comprising an inner channel connected to an inner space of the chamber.

12. The repairing device as claimed in claim 11, wherein the nozzle comprises a button arranged thereat for switching on or switching off the inner channel of the nozzle.

13. The repairing device as claimed in claim 2, wherein a diameter of the tip of the nozzle is approximately equal to $1.0 \times 10^{-6}$ m $\sim 10.0 \times 10^{-6}$ m.

* * * * *